US008415941B2

(12) United States Patent
Max et al.

(10) Patent No.: US 8,415,941 B2
(45) Date of Patent: Apr. 9, 2013

(54) METHOD AND APPARATUS FOR IDENTIFYING AND REDUCING SPURIOUS FREQUENCY COMPONENTS

(75) Inventors: Solomon Max, New York, NY (US); Christopher Joel Hannaford, Norwood, MA (US); R. Warren Necoechea, Scotts Valley, CA (US)

(73) Assignee: LTX-Credence Corporation, Norwood, MA (US)

( * ) Notice: Subject to any disclaimer, the term of this patent is extended or adjusted under 35 U.S.C. 154(b) by 0 days.

(21) Appl. No.: 13/090,560

(22) Filed: Apr. 20, 2011

(65) Prior Publication Data
US 2011/0193547 A1 Aug. 11, 2011

Related U.S. Application Data

(62) Division of application No. 12/170,401, filed on Jul. 9, 2008.

(60) Provisional application No. 60/948,577, filed on Jul. 9, 2007.

(51) Int. Cl.
G01R 19/00 (2006.01)
(52) U.S. Cl. .................................................. 324/76.11
(58) Field of Classification Search ................ 324/76.11
See application file for complete search history.

(56) References Cited

U.S. PATENT DOCUMENTS

| 5,436,600 | A | * | 7/1995 | Van Heteren et al. | ........ 332/167 |
| 5,687,735 | A | | 11/1997 | Forbes et al. | |
| 5,784,413 | A | * | 7/1998 | Chen | ............... 375/308 |
| 5,898,325 | A | | 4/1999 | Crook et al. | |
| 6,236,267 | B1 | | 5/2001 | Anzil | |
| 6,744,261 | B2 | * | 6/2004 | Yamanaka | ...................... 324/616 |
| 6,825,729 | B2 | * | 11/2004 | Splett | ............................... 331/16 |
| 6,867,642 | B1 | | 3/2005 | Maqueira | |
| 6,924,711 | B2 | | 8/2005 | Liu | |
| 7,103,622 | B1 | | 9/2006 | Tucholski | |
| 7,119,553 | B2 | * | 10/2006 | Yang et al. | ..................... 324/663 |
| 7,295,019 | B2 | * | 11/2007 | Yang et al. | ..................... 324/663 |
| 7,388,497 | B1 | * | 6/2008 | Corbett et al. | ............. 340/572.4 |
| 2004/0260506 | A1 | | 12/2004 | Jones et al. | |
| 2005/0063553 | A1 | * | 3/2005 | Ozawa | ............................ 381/92 |
| 2005/0129139 | A1 | | 6/2005 | Jones et al. | |
| 2007/0096759 | A1 | | 5/2007 | Weinraub | |
| 2007/0159185 | A1 | * | 7/2007 | Yang et al. | ..................... 324/663 |
| 2007/0192391 | A1 | | 8/2007 | McEwan | |

(Continued)

*Primary Examiner* — Bot Ledynh
(74) *Attorney, Agent, or Firm* — Holland & Knight LLP; Brian J. Colandreo, Esq.; Mark H. Whittenberger, Esq.

(57) ABSTRACT

A method for identifying and reducing spurious frequency components is provided. A method in accordance with at least one embodiment of the present disclosure may include generating a digital sinusoidal waveform at a direct digital synthesizer (DDS) and receiving the digital sinusoidal waveform at an audio digital-to-analog converter. The method may further include converting the digital sinusoidal waveform to an analog sinusoidal waveform containing spurious frequency components, combining the analog sinusoidal waveform with an analog distortion correction waveform to generate a composite output waveform and receiving the composite output waveform at notch filter circuitry. The method may also include filtering the composite output waveform to generate a filtered composite output waveform and amplifying a difference between the filtered composite output waveform and a signal from a circuit-under-test (CUT) to generate an amplified analog signal. The method may also include converting the amplified analog signal to an amplified digital signal. Of course, additional implementations are also within the scope of the present disclosure.

24 Claims, 4 Drawing Sheets

U.S. PATENT DOCUMENTS

| | | | |
|---|---|---|---|
| 2007/0194986 A1* | 8/2007 | Dulmovits et al. | 342/371 |
| 2007/0253561 A1* | 11/2007 | Williams et al. | 381/58 |
| 2008/0063090 A1* | 3/2008 | Smiley | 375/257 |
| 2009/0033375 A1 | 2/2009 | Max | |
| 2009/0063071 A1 | 3/2009 | Max | |
| 2010/0036455 A1* | 2/2010 | Sanders et al. | 607/48 |
| 2011/0043328 A1 | 2/2011 | Bassali | |
| 2011/0227767 A1 | 9/2011 | O'Brien | |

\* cited by examiner

METHOD AND APPARATUS FOR IDENTIFYING AND REDUCING SPURIOUS FREQUENCY COMPONENTS

CROSS-REFERENCE TO RELATED APPLICATIONS

The subject application is a Divisional Application of U.S. Ser. No. 12/170,401, filed on 9 Jul. 2008, which claims the benefit of Provisional Application No. 60/948,577, filed on 9 Jul. 2007, which is hereby incorporated by reference in its entirety.

TECHNICAL FIELD

This disclosure relates to analyzing distortion and noise in a test signal and, more particularly, to identifying and reducing spurious components generated by testing circuitry.

BACKGROUND

Direct digital synthesis is a method of producing an analog waveform—usually a sine wave—by generating a time-varying signal in digital form and then performing a digital-to-analog conversion. Because operations within a DDS device may be primarily digital, such a device may offer fast switching between output frequencies, fine frequency resolution, and operation over a broad spectrum of frequencies. With advances in design and process technology, today's DDS devices may be very compact and may draw little power.

In some cases, a DDS may be used to digitally generate signals for transmission to a circuit-under-test. These synthesizers may be configured to receive digital data words from a source device and to convert these digital signals to analog signals for transmission to the circuit-under-test.

Unfortunately, the analog output waveform generated by the DDS may have spurious frequency components produced by non-linearities in the DDS. Traditional low-distortion sinusoidal generators require complex filtering techniques to remove all of these spurious components.

SUMMARY OF THE DISCLOSURE

In a first implementation, a method is provided. The method may include generating a digital sinusoidal waveform at a direct digital synthesizer (DDS) and receiving the digital sinusoidal waveform at an audio digital-to-analog converter. The method may further include converting the digital sinusoidal waveform to an analog sinusoidal waveform having spurious frequency components and combining the analog sinusoidal waveform with an analog distortion correction waveform resulting in a composite output waveform. The method may further include receiving the composite output waveform at notch filter circuitry. The method may also include filtering the composite output waveform to generate a filtered composite output waveform and amplifying the filtered composite output to generate an amplified analog signal. The method may also include converting the amplified analog signal to an amplified digital signal.

In various implementations, the method may include storing the amplified digital signal in a memory. The method may further include generating a Discrete Fourier Transform (DFT) of the amplified digital signal to provide at least one of an amplitude and a phase of a non-fundamental component of the analog sinusoidal waveform.

In another implementation, the method may include generating a calibration sequence for the notch filter circuitry, the calibration sequence configured to calculate at least one of a harmonic amplitude and a harmonic phase corresponding to a measured unknown harmonic signal.

The method may also include clocking the ADC relative to at least one of the DAC and the DDS. In some implementations, the method may further include generating a compensating distortion correction signal to subtract the spurious frequency components.

In another implementation an apparatus is provided. The apparatus may include testing circuitry having a direct digital synthesizer (DDS) configured to generate a digital sinusoidal waveform. The testing circuitry may further include an audio digital-to-analog converter configured to receive the digital sinusoidal waveform and to convert the digital sinusoidal waveform to an analog sinusoidal waveform containing spurious frequency components. The analog sinusoidal waveform may be combined with an analog distortion correction waveform to generate a composite output waveform. In some implementations, the testing circuitry may further include notch filter circuitry configured to receive the composite output waveform and to filter the composite output waveform to generate a filtered composite output waveform. The testing circuitry may further include a difference amplifier configured to amplify a difference between the filtered composite output waveform and a signal from a circuit-under-test (CUT) to generate an amplified analog signal. This amplified analog signal may then be converted to an amplified digital signal.

In various implementations the apparatus may include at least one memory configured to store the amplified digital signal. In some implementations the apparatus may also be configured to generate a Discrete Fourier Transform (DFT) of the amplified digital signal to provide at least one of an amplitude and a phase of a non-fundamental component of the analog sinusoidal waveform.

In another implementation, the apparatus may be further configured to generate a calibration sequence for the notch filter circuitry. The calibration sequence may be configured to calculate at least one of a harmonic amplitude and a harmonic phase corresponding to a measured unknown harmonic signal.

In one implementation, the apparatus may be further configured to clock the ADC relative to at least one of the DAC and the DDS. The apparatus may also generate a compensating distortion correction signal to subtract the spurious frequency components. The apparatus may be further configured to filter a harmonic spur using at least one band-pass filter at the notch filter circuitry.

In yet another implementation a method is provided. The method may include generating a sinusoidal waveform using a first waveform generator associated with a first direct digital synthesizer (DDS) for input to a differential amplifier. The method may also include generating, via a second waveform generator associated with a second direct digital synthesizer a phase and amplitude matched sinusoidal waveform through a bandpass filter for input to said differential amplifier. In some implementations the method may further include amplifying the difference between said sinusoidal waveform and said matched sinusoidal waveform via said amplifier to generate an amplified output. The method may further include storing said amplified output and determining at least one of an amplitude and a phase of a spurious frequency component.

DETAILED DESCRIPTION OF THE DISCLOSURE

Generally, the present disclosure relates to a method and apparatus for identifying and reducing spurious frequency components in a direct digital synthesizer (DDS) implementation of a signal source.

In accordance with at least one implementation a DDS may be used to generate sinusoidal waveforms to a set of notch filters configured to measure the amplitude and phase of the spurious distortion components. This information may be stored and subsequently used as part of a calibration sequence or in the introduction of a compensating distortion correction signal to reduce the spurious distortion components.

In accordance with another implementation, a first DDS and waveform generator may be used to generate sinusoidal waveforms to one side of a differential amplifier. A second DDS and waveform generator may be used to generate a second phase and amplitude matched sinusoidal waveform through a bandpass filter to the other side of the differential amplifier. The amplified output of the differential amplifier may then be amplified and captured and used to determine the amplitude and phase of the spurious distortion components.

As used in any embodiment described herein, the term "circuitry" may comprise, for example, singly or in any combination, hardwired circuitry, programmable circuitry, state machine circuitry, and/or firmware that stores instructions executed by programmable circuitry. It should be understood at the outset that any of the operations and/or operative components described in any embodiment or implementation herein may be implemented in software, firmware, hardwired circuitry and/or any combination thereof.

Figure 1:
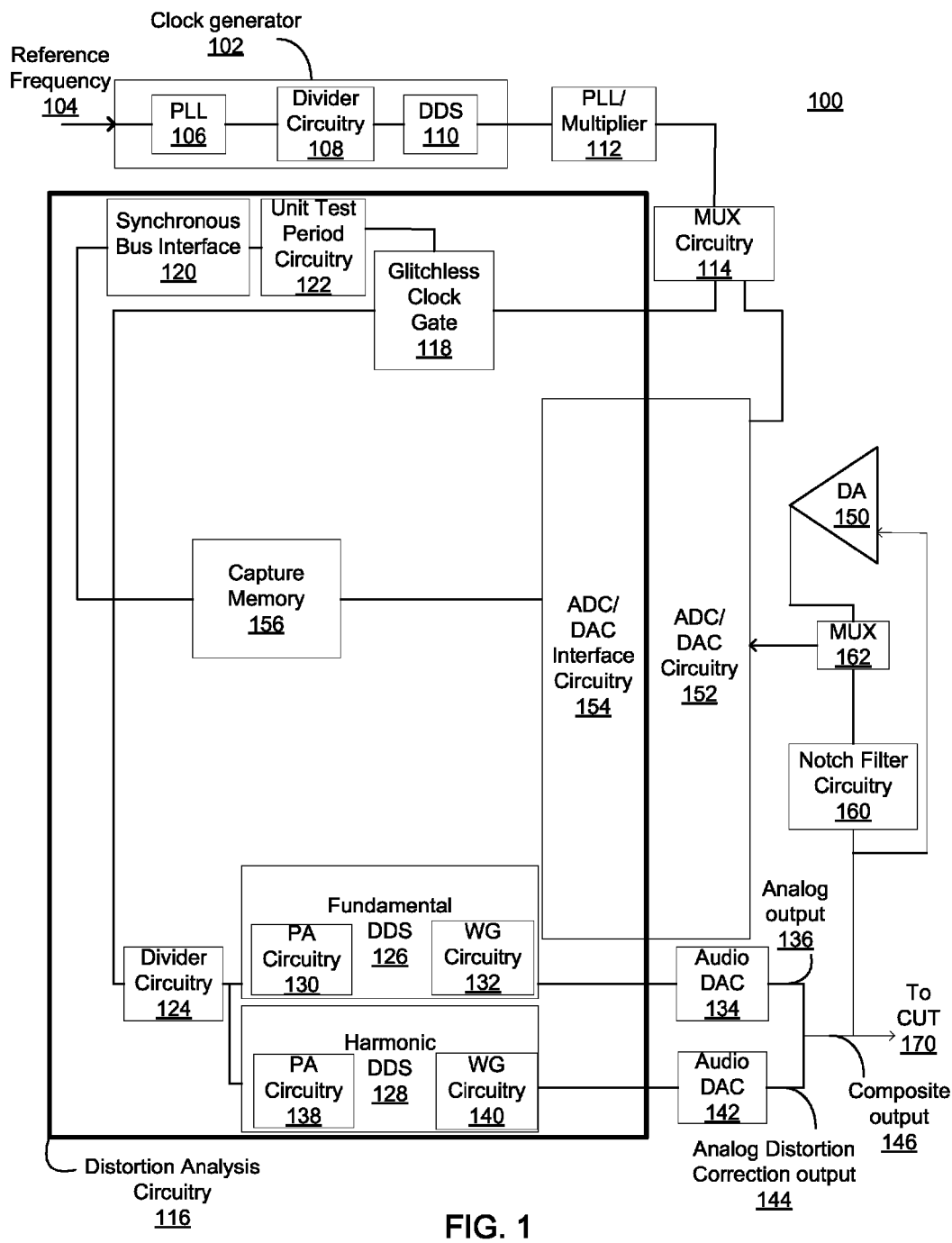
FIG. 1 is a diagrammatic representation of testing circuitry in accordance with an exemplary embodiment of the present disclosure.

Referring to FIG. 1, an embodiment showing testing circuitry 100 is shown. Testing circuitry 100 may include a system clock generator 102 configured to receive a system reference frequency 104. In some embodiments reference frequency 104 may be a 10 MHz frequency, however, numerous other frequencies may be used without departing from the scope of the present disclosure.

System clock generator 102 may be configured to receive system reference frequency 104 at phase locked loop (PLL) 106. PLL 106 may generate an output signal dependent upon both the frequency and phase of system reference frequency 104. This output signal may be received by divider circuitry 108 before entering direct digital synthesizer (DDS) 110. DDS 110 may be configured to receive the output from divider circuitry and to generate an arbitrary waveform from this fixed frequency source. This waveform may be applied to PLL/multiplier 112. DDS 110 may include a number of different components, including, but not limited to, RAM, oscillator circuitry, counter circuitry, ADCs, DACs, etc. PLL/Multiplier 112 may be configured to receive a signal of one frequency range (e.g., 12.5 MHz-25-MHz) and to increase the frequency by a given factor. For example, in this case, a 100 MHz-200 MHz frequency range may be generated if a multiplier of 8 is utilized. The output of PLL/Multiplier 112 may be provided to multiplexer (MUX) circuitry 114, which may be configured to provided the clock frequency to distortion analysis circuitry 116.

As shown in FIG. 1, distortion analysis circuitry 116 may include a number of different components and may be implemented using a number of different implementations. For example, in some implementations, distortion analysis circuitry 116 may be implemented in a field programmable gate array (FPGA), System on a Chip (SoC), an application specific integrated circuit (ASIC), and/or any other type of semiconductor device.

Distortion analysis circuitry 116 may be configured to receive the clock frequency output from MUX circuitry 114 at glitchless clock gate 118. Glitchless clock gate 118 may also be configured to receive a signal from synchronous bus interface 120 via logic 122 and to generate an output, which may be received by divider circuitry 124. Divider circuitry 124 may be configured to receive an input signal having a particular frequency (e.g. 122.88 MHz) and to generate an output frequency having a fraction of the input frequency (e.g. 12.288 MHz). This adjusted frequency signal may then be provided to both the fundamental direct digital synthesizer (DDS) 126 and the harmonic DDS 128, which are each discussed in more detail below.

Fundamental DDS 126 may include a variety of components, including, but not limited to, phase accumulator (PA) circuitry 130 and wave generation circuitry 132. Fundamental DDS 126 may be configured to provide adjustable frequency, phase, amplitude and offset capabilities. In some implementations, PA circuitry 130 may be configured to generate a stream of phase numbers for use by wave generation circuitry 132. Wave generation circuitry 132 may be configured to receive a clock frequency at fundamental DDS 126 and to generate a digital sine wave using the adjusted clock frequency signal and the stream of phase numbers generated by PA circuitry 130.

Wave generation circuitry 132 and 140 (described below) may be configured to implement a variety of different algorithms. Some of these algorithms may include, but are not limited to, Coordinate Rotation Digital Computer (CORDIC), sine-phase difference, modified Sunderland, Nicholas, and Taylor Series approximation algorithms. Of course, numerous other sine wave generation techniques may be employed without departing from the scope of the present disclosure.

As an example, using the values described above, the 12.288 MHz clock frequency signal may be used to drive wave generation circuitry 132 to produce a new digital serial word at the rate of 192 KS/s. The phase and amplitude values may be selected.

Wave generation circuitry 132 may provide the digital serial data stream to audio digital-to-analog (DAC) converter 134. Wave generation circuitry may be configured to generate a digital sinusoidal waveform (202). DAC 134 may then receive the digital sinusoidal waveform (204) and may be configured to convert the serial data stream, e.g., digital sinusoidal waveform, into an analog output waveform 136 that approximates an analog sinusoidal waveform (206). This analog output waveform 136 may contain negligible spurious frequency components Specifically, wave generation circuitry 132 may be configured to implement the following equation:

$$N = A * \sin(\text{Angle} * I + \text{Phase}) \qquad \text{Equation (1)}$$

In Equation 1, A refers to the amplitude of the sine wave that is programmed, Angle and Phase may be programmed values, and I is a number that may begin at 0 and may be incremented by 1 at every clock cycle of the 192 KHz clock.

Similarly, harmonic DDS 128 may also include PA circuitry 138 and wave generation circuitry 140. Harmonic DDS 128 may be configured to cancel at least one harmonic associated with the digital sine wave to generate a digital distortion correction output. The digital distortion correction output may be provided to second DAC 142 to generate an analog distortion correction output 144. Analog distortion correction output 144 may be used to correct for distortion components in DAC 134. The analog output waveform generated by DAC 134 may be combined with the analog distortion correction output to generate a composite output 146 (208) for transmission to a circuit-under-test 170. In some implementations, harmonic DDS 128 may be configured to cancel up to 8 harmonics generated by first audio DAC 134 by analyzing the inherent non-linearities in first audio DAC 134.

In some implementations, composite output 146 may be used to drive an ADC circuit under test CUT, such as CUT 170, to test the CUT. Alternatively, composite output 146 may be used to null a DAC CUT output to generate a null which may be used to evaluate the CUT performance.

Examples of composite output 146 may include, but are not limited to, an 8 VAC peak-to-peak 1 kHz sinusoidal signal. The amplitude, frequency, and type of signal applied to circuitry 160 may vary depending on the type of circuitry being tested (e.g., circuitry under test 170). For example, for some circuit types, a square wave signal or triangle wave signal may be applied to circuitry under test 170. As discussed herein, a sinusoidal wave signal may be provided to circuitry under test 170.

In one implementation, composite output waveform 146 may be provided to notch filter circuitry 160. Notch filter circuitry 160 may be configured to receive the composite output waveform 146 (210) and to filter composite output 146 to generate a filtered composite output (212). Filtered composite output may then be provided to differential amplifier 150, which may amplify a difference between the filtered composite output waveform and a signal from the circuit-under-test to generate an amplified analog signal (214). Amplified analog signal may be converted to an amplified digital signal using ADC/DAC circuitry 152 (216). The amplified digital signal may be stored in capture memory 156.

The term "memory" as described herein, may refer to semiconductor firmware memory, programmable memory, non-volatile memory, read only memory, electrically programmable memory, random access memory, flash memory, magnetic disk memory, and/or optical disk memory.

In some implementations, the clocking of the ADC may be arranged so that the phase of the clocking of the ADC/DAC circuitry 152 is defined relative to DDS 126 and audio DAC 134. A Discrete Fourier Transform (DFT) of the amplified digital signal stored in capture memory 156 may provide amplitude and phase information of a non-fundamental component of the analog sinusoidal waveform output of audio DAC 134.

Once amplitude and phase information has been determined a calibration sequence may be generated for notch filter circuitry 160. The calibration sequence may be configured to calculate at least one of a harmonic amplitude and a harmonic phase corresponding to a measured unknown harmonic signal. In this way, frequencies may be generated by audio DAC 134 at the various expected harmonics and the phase and amplitude response of notch filter circuitry 160 may be measured. Calibration factors may be generated and used to calculate what harmonic amplitude and phase is present when an unknown harmonic is measured. A compensating distortion correction signal may be generated to subtract the spurious frequency components, or the measured harmonic may be used as an expected value in testing a CUT.

Figure 2:
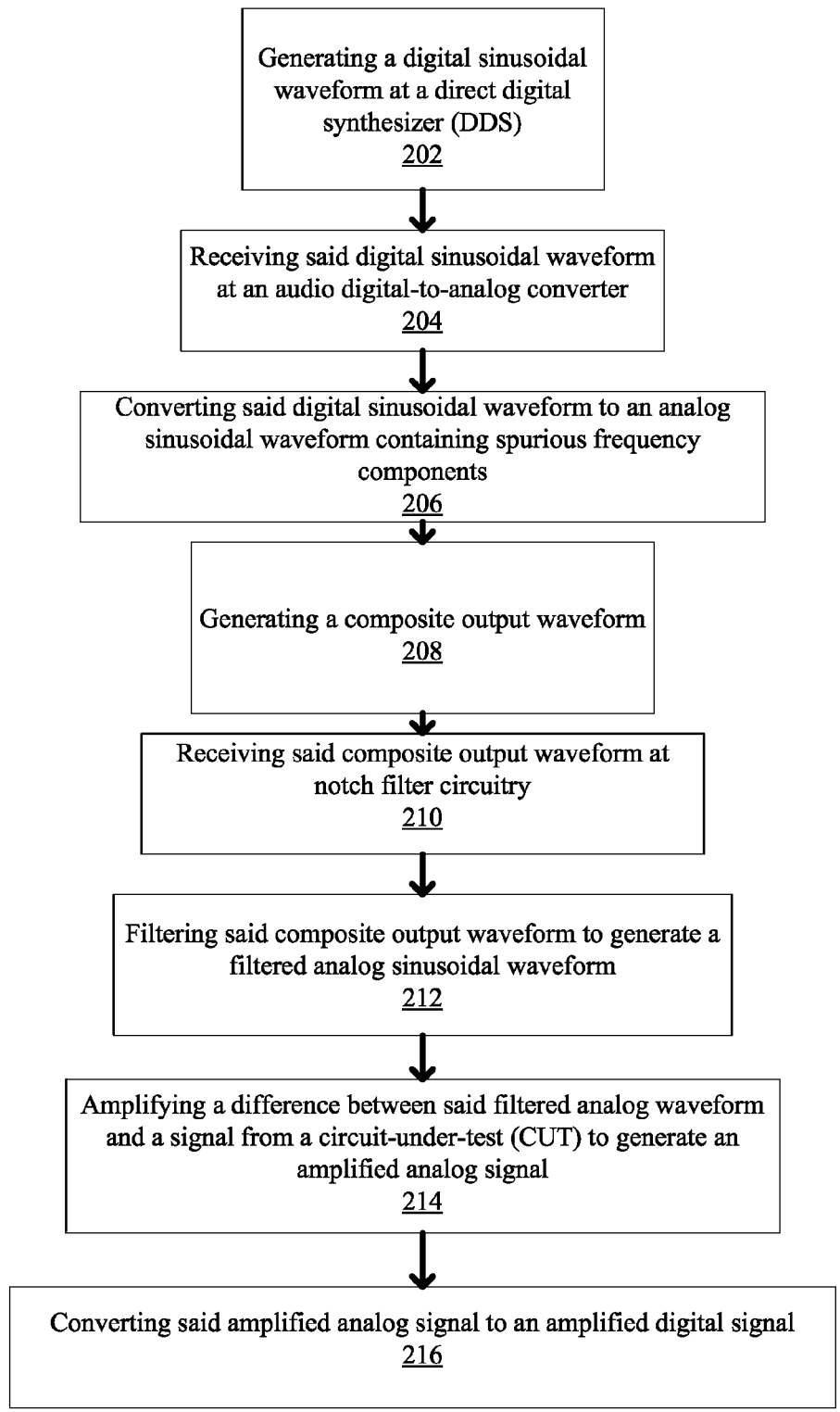
FIG. 2 is a flowchart of a method executed by the testing circuitry of FIG. 1.
Figure 3:
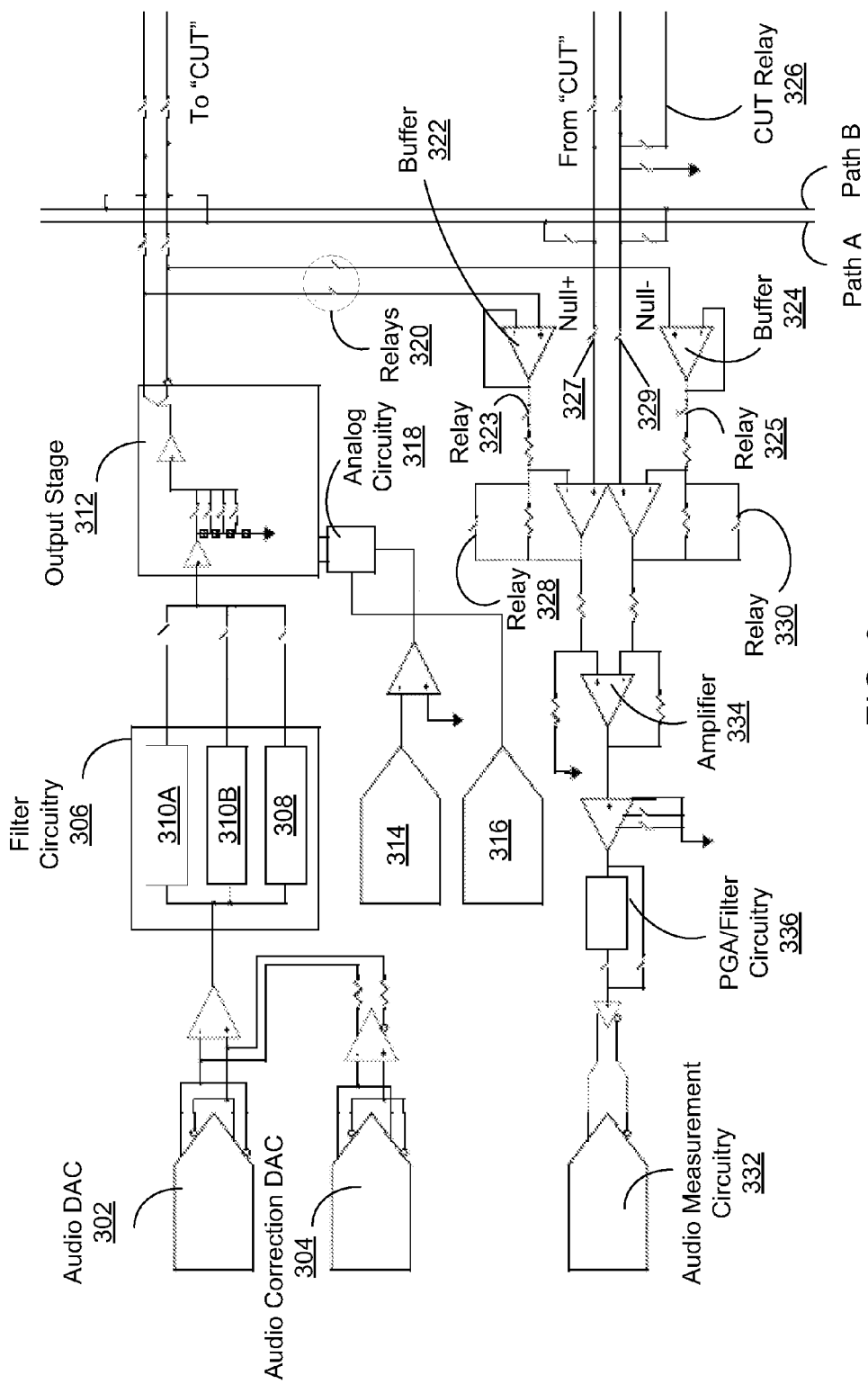
FIG. 3 is a diagrammatic representation of testing circuitry in accordance with yet another exemplary embodiment of the present disclosure.
Figure 4:
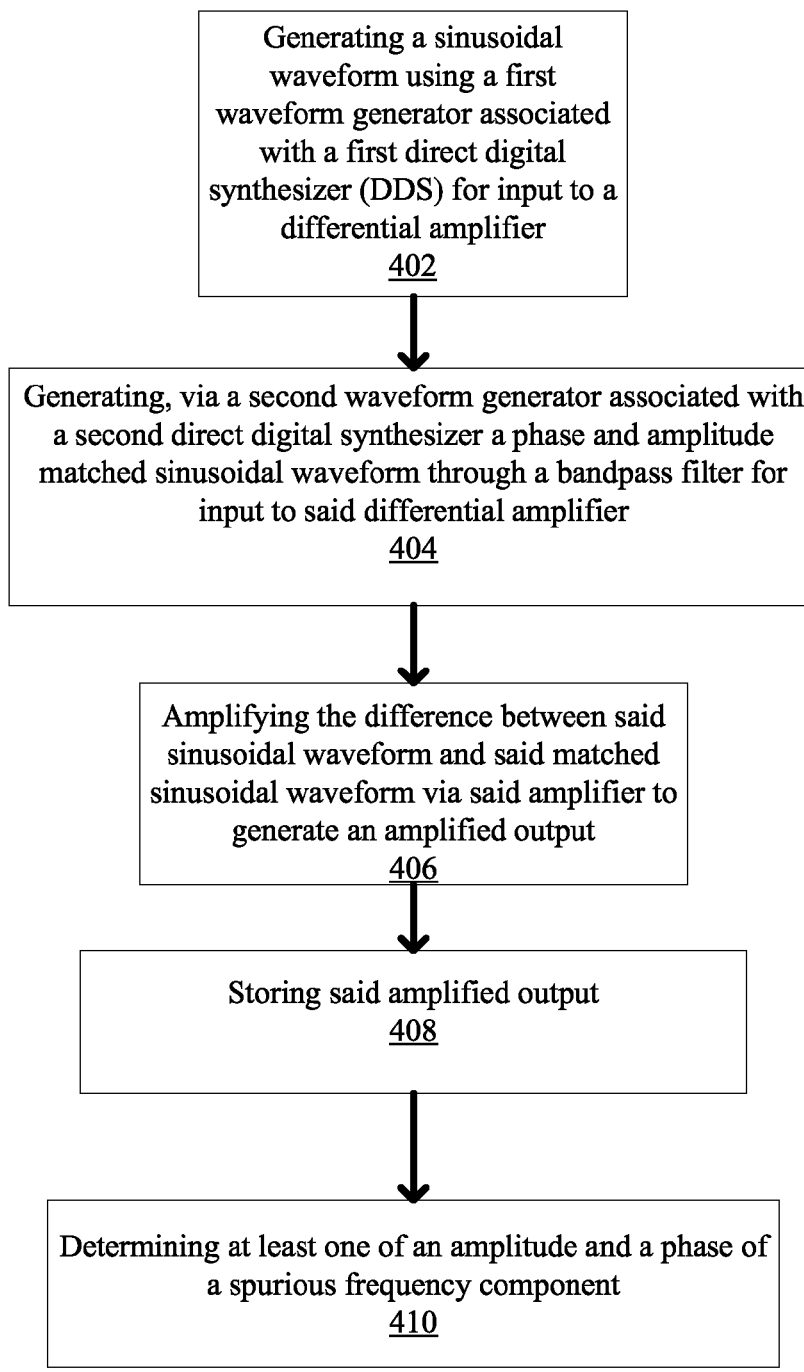
FIG. 4 is a flowchart of a method executed by the circuitry of FIG. 3.

Referring now to FIG. 3 another embodiment of the present disclosure depicting aspects of the test circuitry 300 in greater detail is provided. Test circuitry 300 may include Audio DAC 302 and Audio correction DAC 304. Audio DAC 302 may be configured to receive a signal from wave generation circuitry 132 associated with fundamental DDS 126 shown in FIG. 2. Audio correction DAC 304 may be configured to receive a signal from wave generation circuitry 140 associated with harmonic DDS 128. The outputs of DAC 302 and DAC 304 may be combined to correct the distortions present in the output of DAC 302 to generate the composite output waveform as described above.

The composite output waveform may then be processed by filter circuitry 306. More specifically, filter circuitry 306 may include a lowpass filter 308 and at least one bandpass filter, e.g., 310A and 310B. In some implementations, lowpass filter 308 may act as a reconstruction filter. Bandpass filters 310A and 310B may be used to remove noise and spurious frequency components at frequencies other than near their center frequencies.

The output of filter circuitry 306 may be provided to output stage 312. Output stage 312 may be configured to receive a signal from filter circuitry 306. At output stage 312 the amplitude may be scaled, turned into a differential signal, and an optional common mode voltage from a DAC 314 may be summed into the differential outputs. An additional DAC 316 may work in conjunction with an analog circuitry block 318 to ensure that unwanted errors are not introduced during the signal processing operations performed by output stage 312, e.g., when shifted by a common mode voltage.

In some implementations, bandpass filters 310A and 310B may be used for harmonic spur calibration. Bandpass filters 310A, 310B may be used to measure the harmonic spurs in the Audio Source so that information gathered can be used later to generate the signal stream for audio correction DAC 302.

The calibration technique may use the bandpass filtered Audio Source output of a second identical instrument channel to Null out the fundamental tone of the signal of the Audio Source under calibration. For example, this may be accomplished by using Path A and Path B to route the Audio Output of one channel's Audio Source into the measurement inputs of the channel under test.

In order to measure the harmonic distortion components of fundamental DAC 302 one embodiment of the design first turns off the output of the harmonic correction DAC 304 and routes the fundamental DACs analog output through filter 308 through the output stage 312 and through relays 320 to the Audio Measurement Circuitry's Null+/Null− inputs via buffers 322 and 324 and relays 323 and 325 where it may be subtracted from the audio measurement circuitry's other inputs.

A second audio channel may then configured to have its audio DAC's sinewave output go through bandpass filter 310A (or 310B) whose center frequency should equal the sinetone being produced by the fundamental sine wave DAC 302. Filter 310A may be designed to pass the fundamental tone while greatly attenuating the harmonic spurs found in the output of the fundamental DAC 302. The now cleaned fundamental tone may be routed through the output stage 312 over the Path A/Path B lines back to the first audio channel.

Inside the first audio channel the filtered tone produced by the second channel and present on the Path A/Path B lines via relays 327 and 329 to the none inverting inputs of the channel under calibration measurement circuitry.

Relays 328, 330, 320, and 324 may be used to control what the Audio Measurement circuitry 332 measures. When relays 328 and 330 are closed and 323 and 325 are open then the Audio Measurement circuitry 332 may measure the analog signal passed through intermediate relays 327, 329, which may normally be the circuit under test's signal but is now the filtered sinewave from the other channel. When relays 328, 330 are opened while 323 and 325 are closed, Audio Measurement circuitry 332 may measure the amplified difference of relays 327, 329 and Null+/− inputs.

Amplifier 334 may be configured to convert the outputs of the two measurement input amplifiers into a single ended signal which is relative the board's ground.

PGA/Filter circuitry 336 may include both a programmable gain amplifier and an optional lowpass filter. The ability to add gain allows small amplitude signals to be amplified to a level more optimum for the Audio measurement circuitry 332. The optional filter can be used to band limit the noise seen by the Audio measurement circuitry 332.

Provided the phase and amplitude of the two Audio Source's have been made to match and relays 328 and 330 have been opened while relays 323 and 325 have been closed then the output of amplifier 334 may be a signal with most of the fundamental tone removed but with the harmonics of the unfiltered Audio Source still present. In effect, the time domain may be notched out the fundamental of the Audio Source that is being calibrated while leaving said Audio Source's harmonics for measurement. After gaining up the residual signal we can quite accurately measure with audio measurement circuitry 332 the amplitudes and phases of the Audio Source's harmonic distortion components. From these amplitude and phase components correction settings for the correction DAC 304 may be readily derived.

In some embodiments in order to calibrate the second channel's audio source the roles of the two channels may be reversed. Also, this technique may be repeated a second time with the now mostly corrected DAC 302 and 304 composite analog sinewave signal being sent into the bandpass filter of the reference channel's audio source.

Embodiments of the implementations described above may be implemented in a computer program that may be stored on a storage medium having instructions to program a system to perform the methods. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions. Other embodiments may be implemented as software modules executed by a programmable control device.

A number of implementations have been described. Nevertheless, it will be understood that various modifications may be made. Accordingly, other implementations are within the scope of the following claims.

What is claimed is:

1. A method, comprising:
    generating a sinusoidal waveform using a first waveform generator associated with a first direct digital synthesizer (DDS) for input to a differential amplifier;
    generating, via a second waveform generator associated with a second DDS, a phase and amplitude matched sinusoidal waveform through a bandpass filter for input to the differential amplifier;
    amplifying a difference between the sinusoidal waveform and the matched sinusoidal waveform via the differential amplifier to generate an amplified output;
    storing the amplified output generated by amplifying the difference between the sinusoidal waveform and the matched sinusoidal waveform via the differential amplifier; and
    determining at least one of an amplitude and a phase of a spurious frequency component based upon, at least in part, a Discrete Fourier Transform (DFT) associated with the stored amplified output.

2. The method according to claim 1 wherein determining includes analyzing the amplified output.

3. The method according to claim 1 further comprising measuring at least one harmonic spur generated by an audio digital-to-analog converter using at least one bandpass filter.

4. The method according to claim 1 further comprising generating a signal stream accounting for at least one harmonic spur for an audio correction digital-to-analog converter.

5. The method according to claim 1 further comprising measuring at least one harmonic distortion component of a fundamental digital to analog converter (DAC) by turning off an output of a harmonic correction DAC and routing an analog output of the fundamental DAC through filter circuitry and an output stage for subtraction.

6. The method according to claim 5 further comprising nulling a fundamental tone of an audio source signal under calibration using a bandpass filtered audio source output of an identical instrument channel.

7. The method according to claim 6 further comprising filtering an audio DAC sinewave of a second instrument channel through a bandpass filter having a center frequency equal to a sinetone of the fundamental DAC.

8. The method according to claim 6 further comprising attenuating at least one harmonic spur found in the analog output of the fundamental DAC.

9. A computing system including a processor and memory configured to perform operations comprising, comprising:
    generating a sinusoidal waveform using a first waveform generator associated with a first direct digital synthesizer (DDS) for input to a differential amplifier;
    generating, via a second waveform generator associated with a second DDS, a phase and amplitude matched sinusoidal waveform through a bandpass filter for input to the differential amplifier;
    amplifying a difference between the sinusoidal waveform and the matched sinusoidal waveform via the differential amplifier to generate an amplified output;
    storing the amplified output generated by amplifying the difference between the sinusoidal waveform and the matched sinusoidal waveform via the differential amplifier; and
    determining at least one of an amplitude and a phase of a spurious frequency component based upon, at least in part, a Discrete Fourier Transform (DFT) associated with the stored amplified output.

10. The computing system according to claim 9 wherein determining includes analyzing the amplified output.

11. The computing system according to claim 9 further comprising measuring at least one harmonic spur generated by an audio digital-to-analog converter using at least one bandpass filter.

12. The computing system according to claim 9 further comprising generating a signal stream accounting for at least one harmonic spur for an audio correction digital-to-analog converter.

13. The computing system according to claim 9 further comprising measuring at least one harmonic distortion component of a fundamental digital to analog converter (DAC) by turning off an output of a harmonic correction DAC and routing an analog output of the fundamental DAC through filter circuitry and an output stage for subtraction.

14. The computing system according to claim 13 further comprising nulling a fundamental tone of an audio source signal under calibration using a bandpass filtered audio source output of an identical instrument channel.

15. The computing system according to claim 14 further comprising filtering an audio DAC sinewave of a second instrument channel through a bandpass filter having a center frequency equal to a sinetone of the fundamental DAC.

16. A computer program product residing on a non-transitory computer readable medium having a plurality of instructions stored thereon which, when executed by a processor, cause the processor to perform operations comprising:
generating a sinusoidal waveform using a first waveform generator associated with a first direct digital synthesizer (DDS) for input to a differential amplifier;
generating, via a second waveform generator associated with a second DDS, a phase and amplitude matched sinusoidal waveform through a bandpass filter for input to the differential amplifier;
amplifying a difference between the sinusoidal waveform and the matched sinusoidal waveform via the differential amplifier to generate an amplified output;
storing the amplified output generated by amplifying the difference between the sinusoidal waveform and the matched sinusoidal waveform via the differential amplifier; and
determining at least one of an amplitude and a phase of a spurious frequency component based upon, at least in part, a Discrete Fourier Transform (DFT) associated with the stored amplified output.

17. The computer program product according to claim 16 further comprising measuring at least one harmonic spur generated by an audio digital-to-analog converter using at least one bandpass filter.

18. The computer program product according to claim 16 further comprising generating a signal stream accounting for at least one harmonic spur for an audio correction digital-to-analog converter.

19. The computer program product according to claim 16 further comprising measuring at least one harmonic distortion component of a fundamental digital to analog converter (DAC) by turning off an output of a harmonic correction DAC and routing an analog output of the fundamental DAC through filter circuitry and an output stage for subtraction.

20. The computer program product according to claim 19 further comprising nulling a fundamental tone of an audio source signal under calibration using a bandpass filtered audio source output of an identical instrument channel.

21. The computer program product according to claim 20 further comprising attenuating at least one harmonic spur found in the analog output of the fundamental DAC.

22. The computer program product according to claim 16 wherein determining includes analyzing the amplified output.

23. The computer program product according to claim 20 further comprising filtering an audio DAC sinewave of a second instrument channel through a bandpass filter having a center frequency equal to a sinetone of the fundamental DAC.

24. The computing system according to claim 14 further comprising attenuating at least one harmonic spur found in the analog output of the fundamental DAC.

* * * * *